(12) United States Patent
Moon et al.

(10) Patent No.: US 12,414,350 B2
(45) Date of Patent: Sep. 9, 2025

(54) TRENCH-GATE SIC MOSFET DEVICE AND MANUFACTURING METHOD THEREFOR

(71) Applicant: KOREA ELECTROTECHNOLOGY RESEARCH INSTITUTE, Changwon-si (KR)

(72) Inventors: Jeong Hyun Moon, Gimhae-si (KR); In-Ho Kang, Jinju-si (KR); Sang Cheol Kim, Changwon-si (KR); Hyoung Woo Kim, Changwon-si (KR); Moonkyong Na, Changwon-si (KR); Wook Bahng, Changwon-si (KR); Ogyun Seok, Busan (KR)

(73) Assignee: KOREA ELECTROTECHNOLOGY RESEARCH INSTITUTE, Changwon-si (KR)

( * ) Notice: Subject to any disclaimer, the term of this patent is extended or adjusted under 35 U.S.C. 154(b) by 537 days.

(21) Appl. No.: 17/641,427

(22) PCT Filed: Aug. 31, 2020

(86) PCT No.: PCT/KR2020/011654
§ 371 (c)(1),
(2) Date: Mar. 8, 2022

(87) PCT Pub. No.: WO2021/049801
PCT Pub. Date: Mar. 18, 2021

(65) Prior Publication Data
US 2022/0336602 A1   Oct. 20, 2022

(30) Foreign Application Priority Data

Sep. 10, 2019 (KR) .................. 10-2019-0112452
Jun. 8, 2020 (KR) .................. 10-2020-0069145

(51) Int. Cl.
*H10D 64/27* (2025.01)
*H01L 21/322* (2006.01)
(Continued)

(52) U.S. Cl.
CPC ....... *H10D 64/513* (2025.01); *H01L 21/3223* (2013.01); *H10D 12/031* (2025.01);
(Continued)

(58) Field of Classification Search
CPC ............. H01L 29/7813; H01L 29/7825; H01L 29/66613–66628; H01L 29/66704;
(Continued)

(56) References Cited

U.S. PATENT DOCUMENTS 6,207,494 B1   3/2001   Graimann et al.
10,243,038 B1 *   3/2019   Tanaka ............... H10D 62/8325
(Continued)

FOREIGN PATENT DOCUMENTS

JP   2008-78174 A   4/2008
JP   2009117593 A   5/2009
(Continued)

OTHER PUBLICATIONS

International Search Report mailed on Dec. 9, 2020.
(Continued)

*Primary Examiner* — Wael M Fahmy
*Assistant Examiner* — Quinton A Brasfield
(74) *Attorney, Agent, or Firm* — BROADVIEW IP LAW, PC

(57) ABSTRACT

The present invention relates to a trench-gate SiC MOSFET device and a manufacturing method therefor. The trench-gate SiC MOSFET device of the present invention comprises: a gate oxide film covering a gate trench formed in a SiC substrate (e.g., an n-type 4H-SiC substrate); a doped well (e.g., BPW) formed in a bottom region of the gate
(Continued)

trench; a gate electrode formed in the gate trench covered by the gate oxide film; an interlayer insulating film formed on the gate electrode; a source electrode covering the top surface of a doping layer for a source area formed on the entire surface of an epitaxial layer of the substrate and the top surface of the interlayer insulating film; and a drain electrode formed on the rear surface of the substrate.

4 Claims, 6 Drawing Sheets

(51) Int. Cl.
  *H10D 12/01* (2025.01)
  *H10D 30/66* (2025.01)
  *H10D 62/17* (2025.01)
  *H10D 62/832* (2025.01)

(52) U.S. Cl.
  CPC ....... *H10D 62/393* (2025.01); *H10D 62/8325* (2025.01); *H10D 30/668* (2025.01)

(58) Field of Classification Search
  CPC ......... H01L 29/42336; H01L 29/42352; H01L 29/42356; H01L 29/4236; H01L 29/42376; H01L 29/42384; H01L 29/7856; H01L 21/28114; H01L 21/823437; H01L 21/823828; H01L 21/823456; H01L 21/82385; H01L 21/045; H01L 21/046; H01L 21/0475; H01L 21/049; H01L 21/02378; H01L 21/0445–0495; H10D 30/668; H10D 30/658; H10D 30/0275; H10D 30/6894; H10D 30/699; H10D 64/025–027; H10D 64/513; H10D 62/8325
  See application file for complete search history.

(56) References Cited

U.S. PATENT DOCUMENTS

| | | | |
|---|---|---|---|
| 2009/0114969 A1* | 5/2009 | Suzuki | H10D 30/635 |
| | | | 257/E21.054 |
| 2009/0272982 A1* | 11/2009 | Nakamura | H10D 84/146 |
| | | | 257/77 |
| 2012/0061682 A1 | 3/2012 | Yamamoto et al. | |
| 2012/0187478 A1 | 7/2012 | Takaya | |
| 2014/0197479 A1 | 7/2014 | Um et al. | |
| 2015/0349115 A1 | 12/2015 | Tega et al. | |
| 2016/0247911 A1* | 8/2016 | Hiyoshi | H10D 62/405 |
| 2017/0011921 A1 | 1/2017 | Shibagaki et al. | |
| 2017/0323792 A1 | 11/2017 | Yabuki et al. | |
| 2018/0097069 A1* | 4/2018 | Utsumi | H10D 62/393 |
| 2020/0027716 A1* | 1/2020 | Komatsu | H10D 10/00 |
| 2020/0035810 A1* | 1/2020 | Huang | H01L 21/26586 |
| 2021/0043723 A1* | 2/2021 | Kyogoku | H10D 62/159 |

FOREIGN PATENT DOCUMENTS

| | | |
|---|---|---|
| JP | 2012-64658 A | 3/2012 |
| JP | 2012199382 A | 10/2012 |
| JP | 2013-214658 A | 10/2013 |
| JP | 2018060924 A | 4/2018 |
| KR | 19960007641 B1 | 6/1996 |
| KR | 19970053661 A | 7/1997 |
| KR | 100430322 B1 | 12/2004 |
| KR | 20140091956 A | 7/2014 |
| KR | 20170086561 A | 7/2017 |
| KR | 20190052001 A | 5/2019 |
| WO | 2011039888 A1 | 2/2013 |
| WO | 2014/115253 A1 | 7/2014 |
| WO | 2015/146162 A1 | 10/2015 |

OTHER PUBLICATIONS

Office Action of KR Patent Application No. 10-2020-0069145 mailed on Jul. 22, 2021.
Office Action for JP 2022-515801 by Japan Patent Office dated May 9, 2023.

\* cited by examiner

TRENCH-GATE SiC MOSFET DEVICE AND MANUFACTURING METHOD THEREFOR

CROSS-REFERENCE TO RELATED APPLICATIONS

This application is a National Phase Entry Application of PCT Application No. PCT/KR2020/011654 filed on Aug. 31, 2020, which claims priority to Korean Patent Application No. 10-2019-0112452 filed on Sep. 10, 2019 in Korean Intellectual Property Office and Korean Patent Application No. 10-2020-0069145 filed on Jun. 8, 2020 in Korean Intellectual Property Office, the entire contents of which are hereby incorporated by reference in its entirety.

TECHNICAL FIELD

The present disclosure relates to a trench-gate SiC MOSFET device and, specifically, to a trench-gate SiC MOSFET device and a manufacturing method therefor, wherein $H_2$ annealing and a sacrificial oxidation process (SOP) are performed after the formation of a gate oxide film.

BACKGROUND ART

SiC has been applied to metal oxide semiconductor field effect transistor (MOSFET) devices due to excellent properties thereof, such as low intrinsic carrier concentrations, high dielectric breakdown characteristics, high thermal conductivity, and large electron drift velocity. Especially, the use of SiC is being examined for power devices for ensuring high withstand voltages, and trench-gate structured MOSFETs are mainly dominant for the miniaturization of devices and the reduction of ON-resistance.

Conventional trench-gate MOSFETs, when turned off, have a high potential difference induced between a gate electrode disposed in a trench and a drain electrode below an epitaxial layer. Therefore, an electric field is concentrated at the bottom of the gate trench, and dielectric breakdown occurs at the bottom of a gate oxide layer due to the concentration of the electric field. To reduce such a drawback, attempts have been made to mitigate the concentration of an electric field by thickening the bottom portion compared with the side portion in the gate oxide film. However, thermal oxidation has a drawback in that since the side portion shows a higher oxidation tendency than the bottom portion, the side gate oxidation film becomes very thick when the time of oxidation for thickening the bottom portion is increased.

To solve such a problem, a method has been known in which a trench-gate oxidation film having a thick bottom portion is formed by applying blanket SiO2 film deposition, etch back, thermal oxidation, and the like after the formation of a gate trench. However, MOSFET devices having stable gate oxide films are being required to be manufactured through simpler processes.

DISCLOSURE OF INVENTION

Technical Problem

Accordingly, the present disclosure has been made in view of the above-mentioned problems, and an aspect of the present disclosure is to provide a trench-gate SiC MOSFET device and a manufacturing method therefor, wherein $H_2$ annealing and a sacrificial oxidation process (SOP) are performed before the formation of a gate oxide film, thereby obtaining a trench-gate SiC MOSFET device having a high-quality, stable gate oxide film.

Solution to Problem

According to an aspect of the present disclosure, there is provided a trench-gate SiC MOSFET device, including: a gate oxide film covering a gate trench formed in a SiC substrate (e.g., a 4H—SiC substrate); a doped well formed in a region of the gate trench; a gate electrode formed within the gate trench covered with the gate oxide film; an interlayer dielectric formed on the gate electrode; a source electrode covering an upper surface of a doping layer for a source region formed in a front surface of an epitaxial layer of the substrate and an upper surface of the interlayer dielectric; and a drain electrode formed on a back surface of the substrate.

The substrate with the trench structure may be annealed in a $H_2$ atmosphere before the formation of the gate electrode.

Before the formation of the gate electrode, a carbon capping layer may be formed on the substrate with the trench structure, followed by annealing in an Ar atmosphere and removal of the carbon capping layer, and then the substrate with the trench structure may be annealed in a $H_2$ atmosphere.

Before the formation of the gate electrode, a sacrificial oxidation process (SOP) may be performed in which dry oxidation is conducted at 800-1200° C. for 30-50 minutes.

When the substrate with the trench structure is annealed in a $H_2$ atmosphere before the formation of the gate electrode, a carbon compound generated in a SiC interface by the annealing may be oxidized or removed by the SOP.

Before the formation of the gate electrode, a TEOS gate oxide film may be formed on the substrate with the trench structure, followed by annealing in a NO atmosphere.

The doping layer of the source region formed in the front surface of the epitaxial layer of the substrate may include doping layers on each of the left and right sides of the gate electrode.

When the substrate is a substrate having an N-type epitaxial layer, the doping layer of the source region may include an n+ layer and a p+ layer adjacent to each other in parallel on a p-base layer, on each of the left and right sides of the gate electrode.

In accordance with another aspect of the present disclosure, there is provided a method for manufacturing a trench-gate SiC MOSFET device, the method including: forming a gate trench by etching a SiC substrate (e.g., a 4H—SiC substrate) having a doped layer for a source region deeper than the doped layer for a source region; performing ion implantation to form a doped well in a bottom region of the gate trench; performing annealing; forming a gate oxide film; forming a gate electrode within the gate trench; forming an interlayer dielectric on the substrate with the gate electrode; patterning the gate oxide film and the interlayer dielectric; a source electrode covering an upper surface of the doping layer for the source region formed in a front surface of an epitaxial layer of the substrate and an upper surface of the interlayer dielectric; and forming a drain electrode on a back surface of the substrate.

The annealing may be performed in a $H_2$ atmosphere.

The method may further include, before the performing of the annealing, forming a carbon capping layer on the substrate with the trench structure, followed by annealing in an Ar atmosphere and removal of the carbon capping layer.

The method may include, before the forming of the gate electrode, performing a sacrificial oxidation process (SOP) in which dry oxidation is conducted at 800-1200° C. for 30-50 minutes.

In the method for manufacturing a trench-gate SiC MOSFET device, a carbon compound generated in a SiC interface by the annealing in a $H_2$ atmosphere may be oxidized or removed by the SOP.

A reverse leakage current may be reduced by the SOP process, the reverse leakage current being caused by a leaky interfacial layer formed by the carbon compound in the trench-gate SiC MOSFET device.

The carbon compound may include a graphitic carbon layer.

The method may further include, before the forming of the gate electrode, forming a TEOS oxide film for the formation of the gate oxide film, followed by annealing in a NO atmosphere.

The doping layer of the source region formed in the front surface of the epitaxial layer of the substrate may include doping layers on each of the left and right sides of the gate electrode.

When the substrate is a substrate having an N-type epitaxial layer, the doping layer of the source region may include an n+ layer and a p+ layer adjacent to each other in parallel on a p-base layer, on each of the left and right sides of the gate electrode.

Advantageous Effects of Invention

The trench-gate SiC MOSFET device according to the present disclosure can lead to a trench-gate SiC MOSFET device having a high-quality, stable gate oxide film through $H_2$ annealing and a sacrificial oxidation process (SOP) after the formation of a gate oxide film. Through excellent properties, such as low intrinsic carrier concentrations, high dielectric breakdown characteristics, high thermal conductivity and electron drift velocity, and low ON-resistance in SiC, the trench-gate SiC MOSFET device of the present disclosure can achieve the micronization of devices, that is, the downsizing of cell pitch, and can be operated as a power device for ensuring a high withstand voltage.

BRIEF DESCRIPTION OF DRAWINGS

The accompanying drawings, which are included as a part of the description to help the understanding of the present disclosure, provide embodiments of the present disclosure and, together with the description, explain the technical spirit of the present disclosure.

BEST MODE FOR CARRYING OUT THE INVENTION

Figure 1:
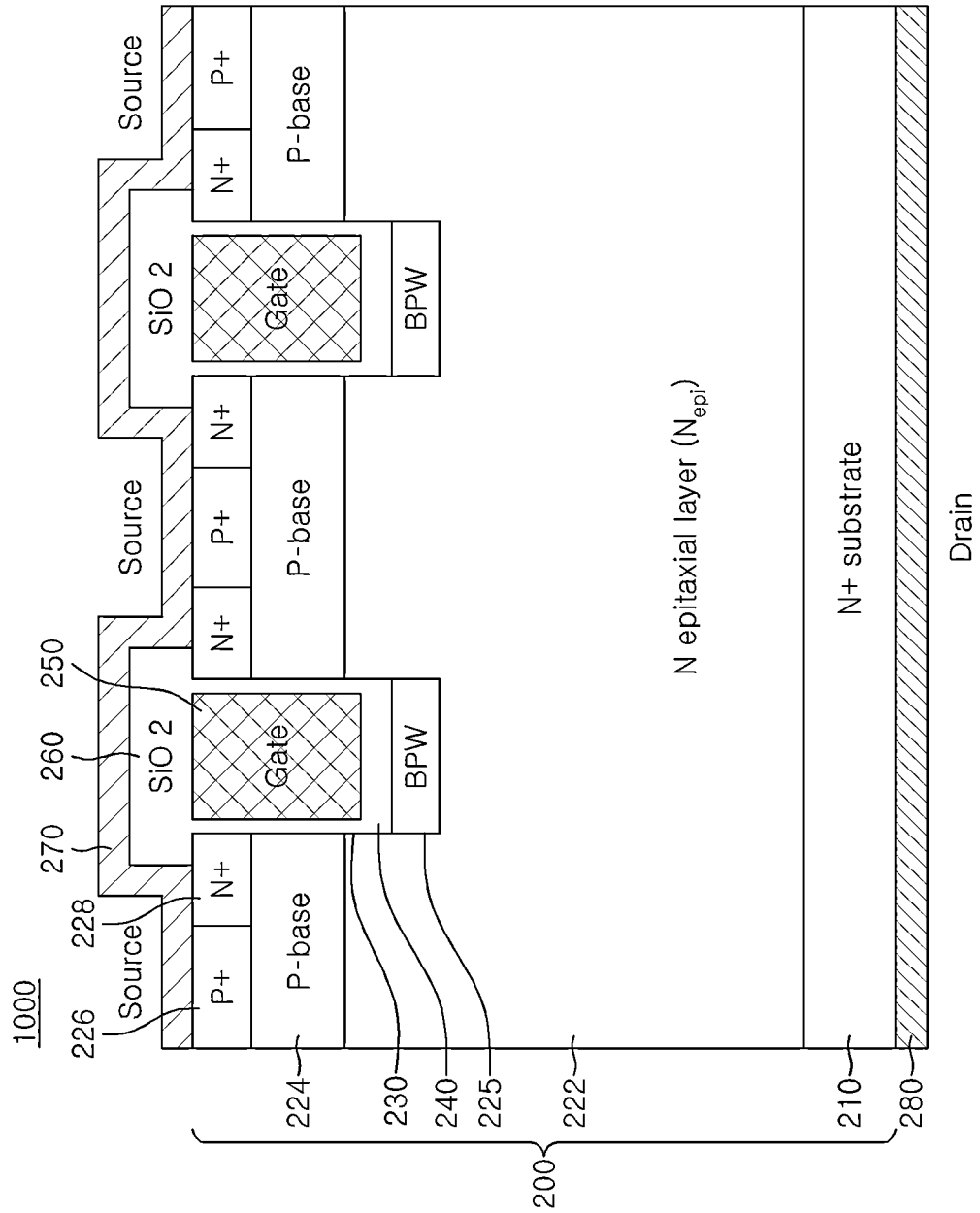
FIG. 1 illustrates a structure of a trench-gate SiC MOSFET device of the present disclosure.

Hereinafter, the present disclosure will be described in detail with reference to the accompanying drawings. In each drawing, like elements are denoted by like reference numerals. Further, the detailed description of well-known functions and/or configurations will be omitted. The following disclosed contents mainly describe portions required to understand operations according to various embodiments and the description of elements which make the gist of the description obscure will be omitted. Further, some of elements of the drawings may be exaggerated, omitted, or schematically illustrated. A size of each element does not completely reflect a real size, and therefore the contents disclosed herein are not limited by a relative size or interval of the elements illustrated in the drawings.

In describing embodiments of the present disclosure, when it is determined that a detailed description with respect to known technology related to the present disclosure may unnecessarily obscure a gist of the present disclosure, a detailed description thereof will be omitted. The terminology used hereinafter is terms defined by considering functions in embodiments of the present disclosure, and their meaning may be changed according to intentions of a user and an operator, customs, or the like. Accordingly, the term shall be defined based on the contents throughout this specification. The term used in the detailed description is used for describing embodiments of the present disclosure, and is not used for limiting the present disclosure. The singular forms are intended to include the plural forms as well unless the context clearly indicates otherwise. It will be further understood that the terms "comprises", "comprising", "includes", and/or "including", when used herein, specify the presence of stated features, figures, steps, operations, elements, or some or combinations thereof, but do not preclude the presence or possibility of one or more other features, figures, steps, operations, elements, or some or combinations thereof.

The terms first, second, and the like may be used herein to describe various elements, but these elements shall not be limited by these terms, and these terms are only used to distinguish one element from another element.

Figure 2:
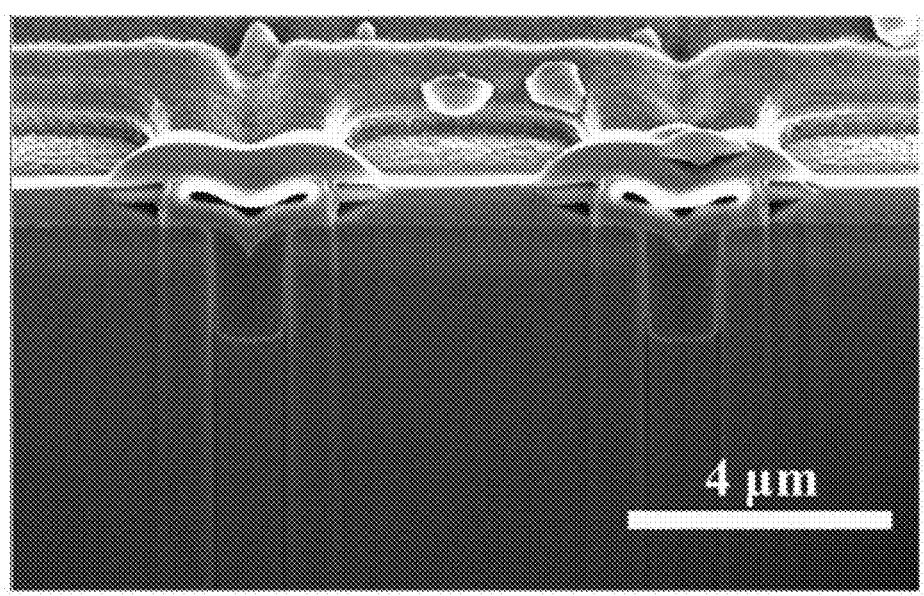
FIG. 2 illustrates an exemplary SEM image for a sectional structure of the trench-gate SiC MOSFET device of the present disclosure.

FIG. 1 illustrates a structure of a trench-gate SiC MOSFET device 1000 of the present disclosure. FIG. 2 illustrates an exemplary SEM image for a sectional structure of the trench-gate SiC MOSFET device 1000 of the present disclosure.

Referring to FIGS. 1 and 2, the trench-gate SiC MOSFET device 1000 of the present disclosure includes: a gate oxide film 240 covering a gate trench 230 formed in a substrate (e.g., n-type 4H—SiC substrate) having an epitaxial layer 222; a doped well (e.g., bottom p-well (BPW)) 225 formed below the gate oxide film 240 in a region of the gate trench 230; a gate electrode 250 formed inside the gate trench 230 covered with the gate oxide film 240; an interlayer dielectric 260 formed on the gate electrode 250; a source electrode 270 covering upper surfaces of doping layers 224, 226, and 228 for a source region formed in the front surface of the epitaxial layer of the SiC substrate 200 and an upper surface of an interlayer dielectric 260; and a drain electrode 280 formed on the back surface of the SiC substrate 200.

The source region formed in the front surface of the epitaxial layer 222 of the SiC substrate 200 includes the doping layers 224, 226, and 228 at each of the left and right sides of the gate electrode 250.

When the SiC substrate 200 is a substrate having an n-type epitaxial layer as shown in the drawing, the doping layers 224, 226, and 228 of the source region include an n+ layer 228 as a high-concentration n-type doping layer and a p+ layer 226 as a high-concentration p-type doping layer, which are adjacent to each other in parallel, on a p-base layer 224 is a low-concentration p-type doping layer.

Hereinafter, a manufacturing method for the trench-gate SiC MOSFET device 1000 of the present disclosure will be described in detail with reference to FIG. 3.

Figure 3:
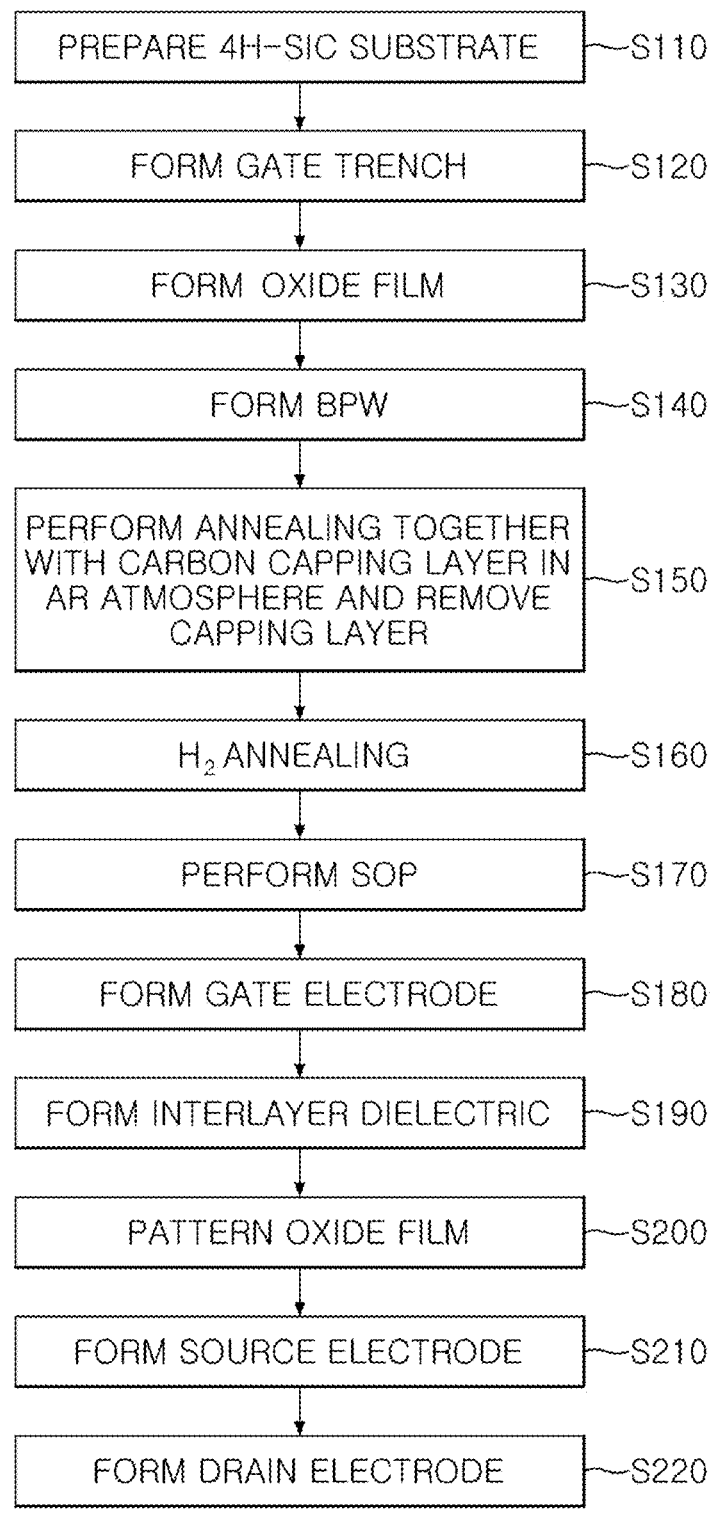
FIG. 3 illustrates a manufacturing method for the trench-gate SiC MOSFET device of the present disclosure.

FIG. 3 illustrates a manufacturing method for the trench-gate SiC MOSFET device 1000 of the present disclosure.

Referring to FIG. 3, for example, a substrate 200 is first prepared in which an n-type (e.g., doped at a concentration of $7\times10^{15}$ cm$^{-3}$) epitaxial layer 222 is formed on a substrate 210 (e.g., 6-inch n-type 4° off-axis <0001> aligned 4H—SiC substrate) and doping layers 224, 226, and 228 for a source region are formed in a front surface of the epitaxial layer 222 (S110). When the substrate 200 is a substrate having an n-type epitaxial layer as shown in the drawing, the doping layers 224, 226, and 228 of the source region include an n+ layer 228 as a high-concentration n-type doping layer and a p+ layer 226 as a low-concentration p-type doping layer, which are adjacent to each other in parallel, on a p-base layer 224 as a high-concentration p-type doping layer. For example, the p-base layer 224 and the p+ layer 226 may be formed by injection of Al ions and the n+ layer 228 may be formed by injection of N (nitrogen) ions.

Then, a gate trench 230 is formed by etching deeper than the doping layers 224, 226, and 228 of the source region (S210). For example, $SiO_2$ deposited by a plasma-enhanced chemical vapor deposition (PECVD) system is patterned with respect to an area corresponding to a region where a gate electrode 250 is to be formed, and a dry etcher using inductive coupled plasma (ICP) is used while the pattern is used as an etching mask, thereby forming a trench (e.g., a trench depth of about 2 μm). For example, trenches with a trench cell pitch of 6.5 μm were formed in an active region of 5×5 mm$^2$.

Then, an oxide film is formed (S130). For example, an insulating film of $SiO_2$ with a thickness of 50-110 nm may be formed on the entire region of the substrate with the trench structure including the side wall and bottom surface of the gate trench. In an embodiment, the thickness of the oxide film on the side wall of the trench was about 80 nm.

Below the oxide film, in the bottom region of the gate trench 230, a doped well (e.g., BPW) 225 is formed by ion implantation of, for example, Al ions (S140).

After the doped well (e.g., BPW) 225 is formed, the oxide film is removed, a carbon capping layer is formed on the substrate with the trench structure, followed by annealing at a temperature of 1500-1900° C. (e.g., 1700° C.) for 50-70 minutes (e.g., 60 minutes) in an Ar atmosphere, and then the carbon capping layer may be removed by $O_2$ plasma asking (S150).

After the annealing in the Ar atmosphere, the annealing of the substrate with the trench structure is conducted in a $H_2$ atmosphere at a temperature of 1200-1600° C. (e.g., 1400° C.) for 10-30 minutes (e.g., 20 minutes) to control the shape of the gate trench 230 and smoothen the side wall of the gate trench 230 (S160).

In addition, before a gate electrode 250 is formed, a sacrificial oxidation process (SOP) is performed. For example, dry oxidation may be conducted on the gate trench of the substrate with the trench structure 230 at 800-1200° C. (e.g., 1000° C.) for 30-50 minutes (e.g., 40 minutes). For comparison, a sample manufactured without SOP is also prepared.

After the sacrificial oxidation process (SOP) is performed, a tetraethoxysilane (TEOS) oxide film for the formation of gate oxide film (240) is formed at for example 720° C. by a low pressure chemical vapor deposition (LPCVD) system, and oxidation and annealing in a NO atmosphere, that is, nitriding annealing, may be conducted at 800-1200° C. (e.g., 1175° C.) for 60-180 minutes (e.g., 120 minutes). For comparison, a sample manufactured without SOP is also prepared.

Then, a gate electrode 250 is formed in the gate trench 230 by using a conductive material, such as a metal or polycrystalline Si (S180). For example, highly doped n-type polycrystalline Si may be deposited using a CVD system or the like, followed by patterning, thereby forming the gate electrode 250. An upper surface of the gate electrode 250 is preferably made to be the same plane as the surfaces of the doping layers 224, 226, and 228 of the epitaxial layer 222.

Then, an interlayer dielectric 260 is formed on the substrate with the gate electrode 250 (S190). The interlayer dielectric 260 may be composed of an insulating film such as $SiO_2$.

Then, the gate oxide film 240 and the interlayer dielectric 260 may be simultaneously subjected to patterning through an exposure process using one mask (S200).

Then, a source electrode 270 is formed using a metal such as a conductive material (e.g., Ti) (S210). For example, a source electrode 270 is formed that covers the upper surfaces of the doping layers 224, 226, and 228 for the source region formed in the front surface of the epitaxial layer 222 of the substrate 200 and the upper surface of the interlayer dielectric 260.

Then, a drain electrode 280 is formed on a back surface of the substrate 200 by using a conductive material such as a metal (e.g., Ni/Ti alloy) (S220).

Ohmic layers may be formed before the formation of the source electrode 270 and the drain electrode 280.

Last, input and output pad metals, respectively, connected to the gate electrode 250, the source electrode 270, and the drain electrode 280, may be formed of Al.

Figure 4A:
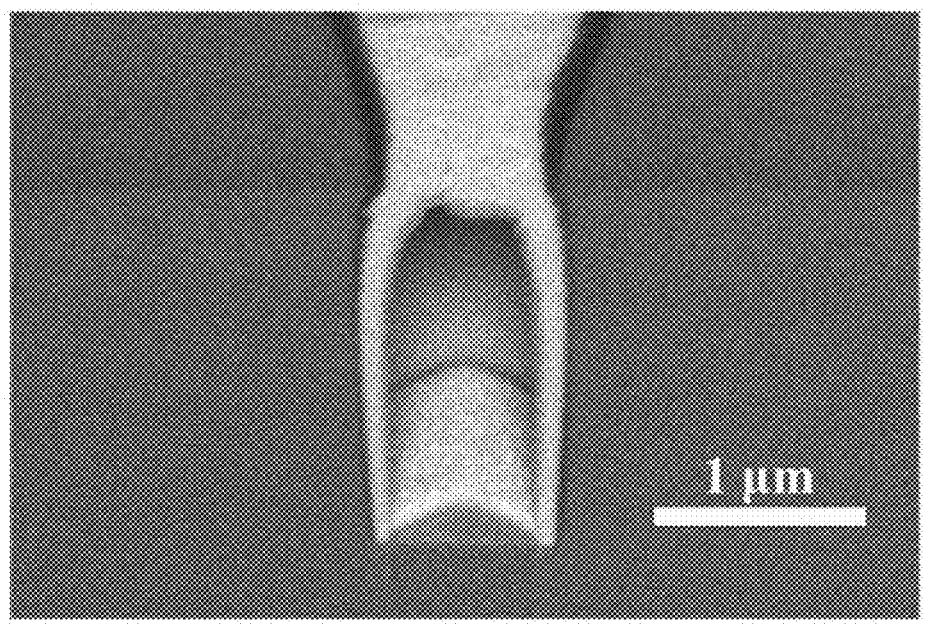
FIGS. 4A and 4B illustrate exemplary SEM images for a trench shape before and after $H_2$ annealing in a trench-gate SiC MOSFET device of the present disclosure.
Figure 4B:
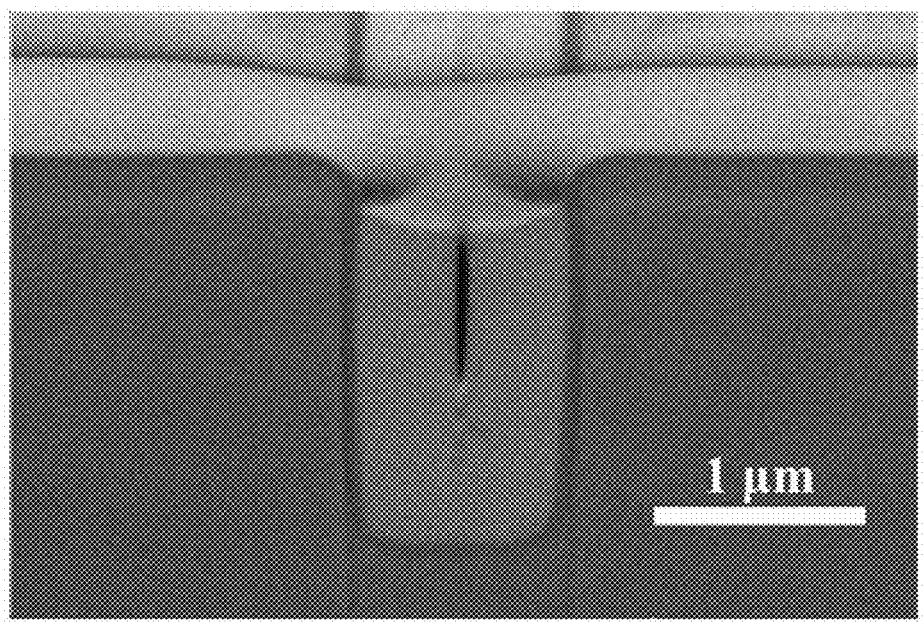

FIGS. 4A and 4B illustrate exemplary SEM images for a trench shape before and after $H_2$ annealing in the trench-gate SiC MOSFET device 1000 of the present disclosure.

FIG. 4A illustrates an exemplary SEM image before $H_2$ annealing after the formation of the gate oxide film 240, and FIG. 4B illustrates an exemplary SEM image after $H_2$ annealing after the formation of the gate oxide film 240. After $H_2$ annealing, the upper and lower corners of the trench 230 were rounded, and the surface of the side wall of the trench 230 was more smoothened.

Figure 5A:
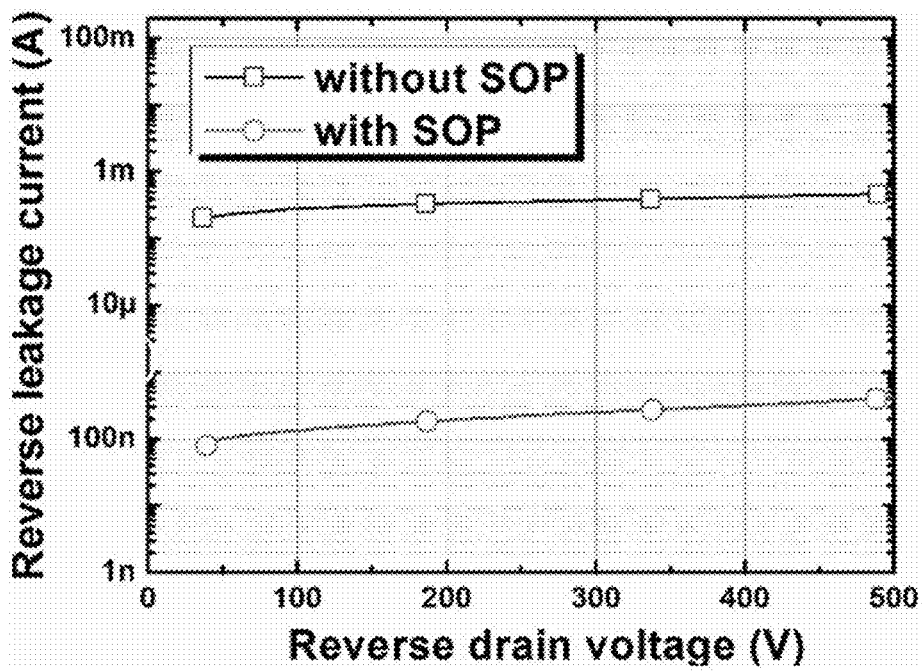
FIGS. 5A and 5B illustrate examples of reverse leakage current characteristics and breakdown voltage characteristics in the reverse bias in trench-gate SiC MOSFET devices of the present disclosure manufactured with and without SOP.
Figure 5B:
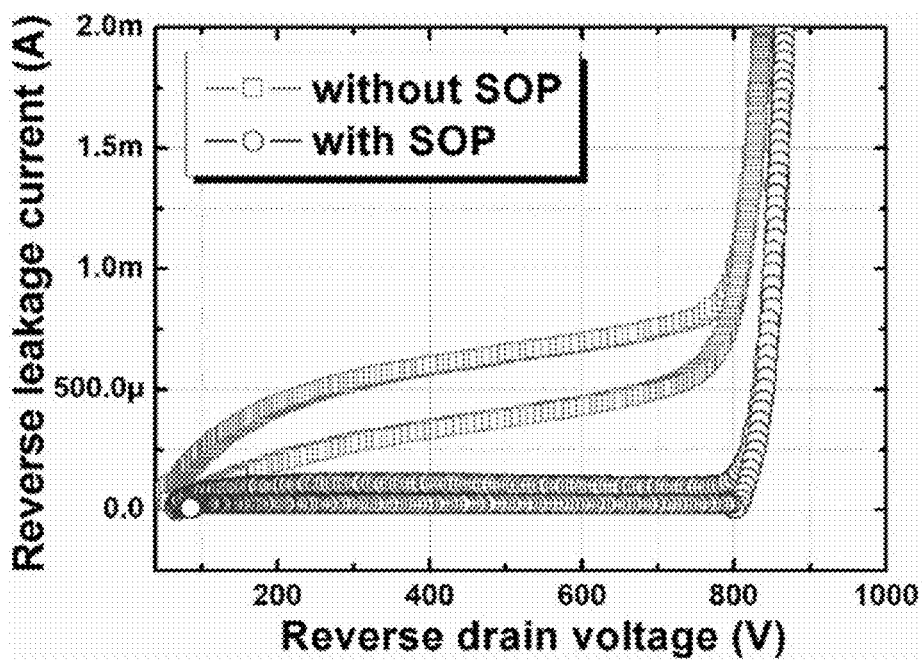

FIGS. 5A and 5B illustrate examples of reverse leakage current characteristics and breakdown voltage characteristics in the reverse bias with and without SOP in a trench-gate SiC MOSFET device 1000 of the present disclosure.

As shown in FIG. 5A, the trench MOSFET manufactured without SOP showed three times higher reverse leakage current in the gate reverse bias than the trench MOSFET manufactured with SOP. It is expected that in the MOSFET manufactured without SOP, the interfacial layer would react with the gate oxide film 240 in the SiC interface to form a carbon compound (a graphitic carbon layer or the like) during the $H_2$ annealing process by which the surface layer may be chemically transformed. It is therefore assumed that the carbon compound is oxidized and removed during the SOP treatment. The breakdown voltage of the MOSFET manufactured with or without SOP was measured in 800 to 900 V as shown in FIG. 5B. It can be seen that SOP had no great influence on breakdown voltage characteristics.

Figure 6:
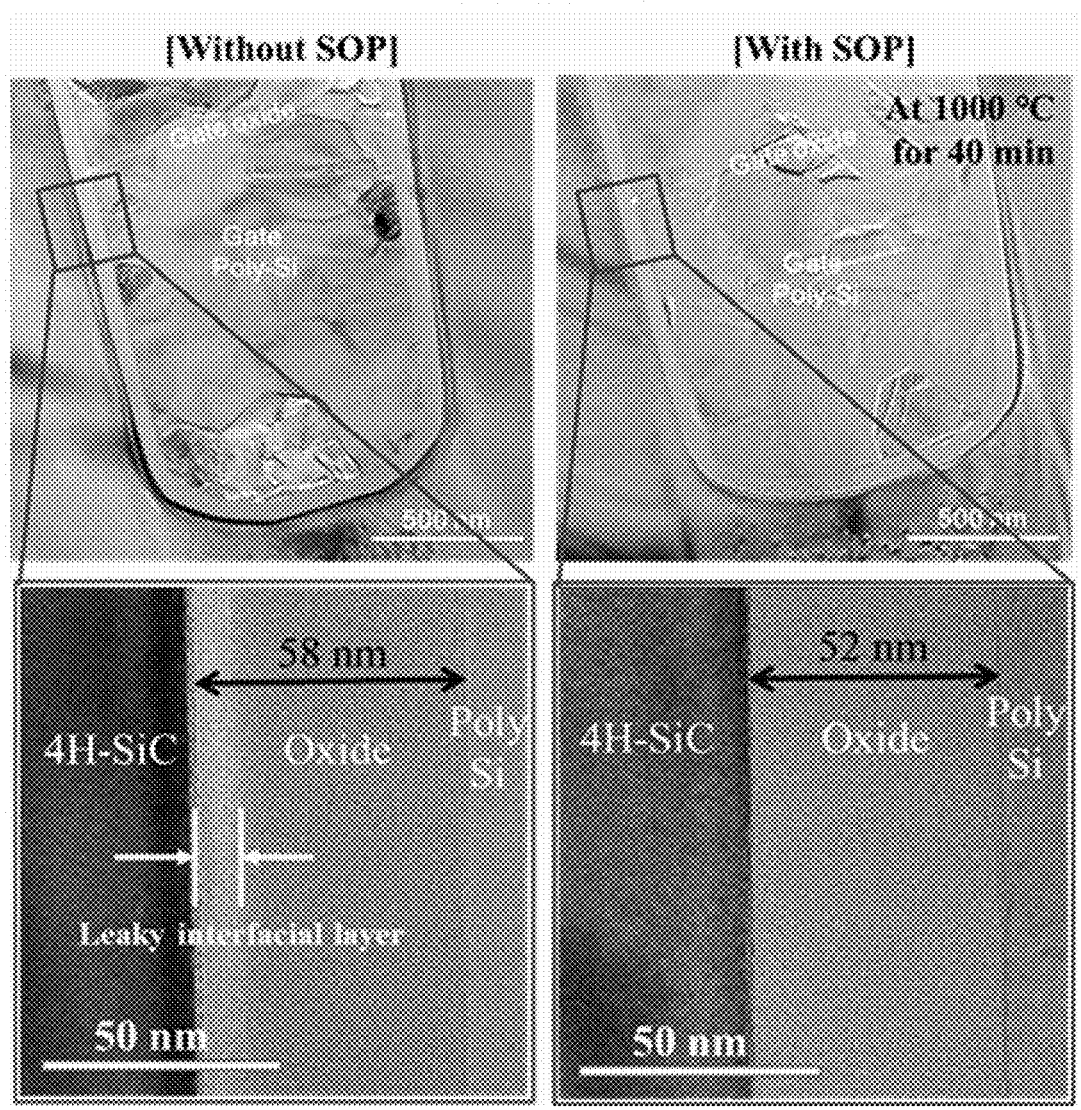
FIG. 6 illustrates images showing transmission microscope observation results according to whether a trench-gate SiC MOSFET device of the present disclosure is manufactured with or without SOP.

FIG. 6 illustrates images showing transmission microscope observation results according to the SOP treatment in a trench-gate SiC MOSFET device of the present disclosure.

Referring to FIG. 6, the reason why the reverse leakage current characteristics were improved through the sacrificial oxidation process (SOP) can be confirmed by TEM, which shows that a thick interfacial layer was observed at the interface of the gate oxide film in the device manufactured without SOP. This interfacial layer was considered to be a layer formed during the process for the gate oxide film after hydrogen annealing and was assumed to be a leaky interfacial layer. According to the reported results (Y. Kawada et al., Jpn. J. appl. Phys. 48 (2009), p. 116508), a carbon layer may be formed on a SiC surface at 1700° C. in an Ar atmosphere during annealing, and the reason has been reported to be that the carbon remaining after sublimation of Si in the high-temperature SiC surface forms a graphitic carbon layer. Similarly, the graphitic carbon layer remaining in the SiC surface is considered to be effectively removed in the sacrificial oxidation process. In the interface of the trench-gate oxide film of the device manufactured without the sacrificial oxidation process, a carbon compound is highly likely to be generated, and the interfacial layer containing the resultant graphitic carbon with high conductivity causes a high leakage current.

As set forth above, the trench-gate SiC MOSFET device 1000 according to the present disclosure can provide a trench-gate SiC MOSFET device having a high-quality, stable gate oxide film through $H_2$ annealing and SOP after the formation of the gate oxide film 240. Through excellent properties, such as low intrinsic carrier concentrations, high dielectric breakdown characteristics, high thermal conductivity and electron drift velocity, and low ON-resistance in SiC, the trench-gate SiC MOSFET device 1000 enables the micronization of devices, that is, the downsizing of cell pitches, and can be operated as a power device for ensuring a high withstand voltage.

The specified matters and limited embodiments and drawings such as specific elements in the present disclosure have been disclosed for broader understanding of the present disclosure, but the present disclosure is not limited to the embodiments, and various modifications and changes are possible by those skilled in the art without departing from an essential characteristic of the present disclosure. Therefore, the spirit of the present disclosure is defined by the appended claims rather than by the description preceding them, and all changes and modifications that fall within metes and bounds of the claims, or equivalents of such metes and bounds are therefore intended to be embraced by the range of the spirit of the present disclosure.

The invention claimed is:

1. A method for manufacturing a trench-gate SiC MOSFET device, the method comprising:
    forming a gate trench by etching a 4H—SiC substrate having a doped layer for a source region, the gate trench being deeper than the doped layer for a source region;
    forming a first gate oxide film;
    performing ion implantation to form a doped well in a bottom region of the gate trench;
    removing the first gate oxide film;
    performing annealing in a $H_2$ atmosphere;
    performing a sacrificial oxidation process (SOP) in which dry oxidation is conducted at 800-1200° C. for 30-50 minutes;
    forming a second gate oxide film with TEOS oxide film, followed by annealing in a NO atmosphere;
    forming a gate electrode within the gate trench;
    forming an interlayer dielectric on the substrate with the gate electrode;
    patterning the second gate oxide film and the interlayer dielectric;
    a source electrode covering an upper surface of the doped layer for the source region formed in a front surface of an epitaxial layer of the substrate and an upper surface of the interlayer dielectric; and
    forming a drain electrode on a back surface of the substrate,
    wherein a carbon compound generated in a SiC interface by the annealing in the $H_2$ atmosphere is oxidized or removed by the SOP and a reverse leakage current is reduced by the SOP process, the reverse leakage current being caused by a leaky interfacial layer formed by the carbon compound including a graphitic carbon layer in the trench-gate SiC MOSFET device.

2. The method of claim 1, further comprising, before the performing of the annealing, forming a carbon capping layer on the substrate with the trench structure, followed by annealing in an Ar atmosphere and removal of the carbon capping layer.

3. The method of claim 1, wherein the doped layer of the source region formed in the front surface of the epitaxial layer of the substrate includes doping layers on each of the left and right sides of the gate electrode.

4. The method of claim 1, wherein when the substrate is a substrate having an N-type epitaxial layer, the doped layer of the source region includes an n+ layer and a p+ layer adjacent to each other in parallel on a p-base layer, on each of the left and right sides of the gate electrode.

* * * * *